United States Patent [19]

Sud et al.

[11] Patent Number: 4,570,244
[45] Date of Patent: Feb. 11, 1986

[54] BOOTSTRAP DRIVER FOR A STATIC RAM

[75] Inventors: Rahul Sud, Colorado Springs; Kim C. Hardee, Manitou Springs, both of Colo.

[73] Assignee: Inmos Corporation, Colorado Springs, Colo.

[21] Appl. No.: 698,552

[22] Filed: Feb. 6, 1985

Related U.S. Application Data

[62] Division of Ser. No. 172,766, Jul. 28, 1980, Pat. No. 4,500,799.

[51] Int. Cl.⁴ .................... G11C 8/00; H03K 19/017; H03K 17/10; H03K 19/094
[52] U.S. Cl. .................................. 365/230; 307/449; 307/482; 307/578; 307/296 A; 307/246; 307/270
[58] Field of Search ............... 307/449, 450, 463, 482, 307/578, 594, 601, 605, 246, 584, 296 A; 365/230, 189, 226, 227, 228, 269

[56] References Cited

U.S. PATENT DOCUMENTS

| | | | |
|---|---|---|---|
| 3,769,528 | 10/1973 | Chu et al. | 307/270 |
| 3,808,468 | 4/1974 | Ludlow et al. | 307/304 |
| 3,875,426 | 4/1975 | Baitinger et al. | 307/449 |
| 3,982,138 | 9/1976 | Luisi et al. | 307/450 X |
| 3,986,044 | 10/1976 | Madland et al. | 307/482 |
| 3,995,171 | 11/1976 | Sonoda | 307/449 |
| 4,048,518 | 9/1977 | Koo | 307/448 |
| 4,071,783 | 1/1978 | Knepper | 307/246 X |
| 4,093,875 | 6/1978 | Knepper | 307/584 |
| 4,096,584 | 6/1978 | Owen, III et al. | 365/227 |
| 4,176,289 | 11/1979 | Leach et al. | 307/578 X |
| 4,284,905 | 8/1981 | Rosenzweig | 307/270 X |
| 4,300,213 | 11/1981 | Tanimura et al. | 307/482 X |
| 4,317,051 | 2/1982 | Young, Jr. | 307/578 X |
| 4,352,996 | 10/1982 | White, Jr. | 307/578 X |
| 4,355,377 | 10/1982 | Sud et al. | 307/482 X |

FOREIGN PATENT DOCUMENTS 2853204 6/1979 Fed. Rep. of Germany .

Primary Examiner—Larry N. Anagnos
Attorney, Agent, or Firm—Edward D. Manzo; Roger R. Wise

[57] ABSTRACT

A bootstrap driver circuit is used asynchronously in a static RAM. A capacitor is coupled between second and third nodes, and a charge pump is coupled to provide charge to the second node. Address bits can be applied to the gates of respective transistors whose drains form a common node coupled to the source of a low impedance transistor whose drain is coupled to a first node. An inverter is coupled to the common node for applying a delayed input signal to the gates of first and second enhancement mode transistors. This provides a discharge path for the third node in response to a low level memory address signal thereby to maintain a differential voltage across the bootstrap capacitor. Also disclosed is an input protection circuit when the bootstrap driver is used as a chip select buffer. A timing circuit receives an input signal and develops a first signal and a delayed signal, both of which are applied to the bootstrap driver. One embodiment particularly useful for overcoming gliches on an input signal uses a charge pump, a latch and release network, an inverting buffer, and a bootstrap isolation transistor. An early discharge transistor and a late discharge transistor provide a discharge path for the isolation transistor. The early discharge transistor is responsively coupled to the digital input signal, and the late discharge transistor is responsively coupled to the output of the inverting buffer.

5 Claims, 5 Drawing Figures

BOOTSTRAP DRIVER FOR A STATIC RAM

This is a division of application Ser. No. 172,766, filed July 28, 1980, now U.S. Pat. No. 4,500,799.

BACKGROUND OF THE INVENTION

The invention is directed generally to improvements in MOS (metal oxide semiconductor) memories, and particularly to an improved bootstrap driver circuit for use in such memories.

MOS memories generally include row and column decoders, clock generators and a variety of buffers. At the heart of all such circuits are drivers which function essentially to receive a digital input signal to develop as rapidly as possible a strong output signal. Some such drivers include a capacitor in a regenerative feedback loop to "bootstrap" the output signal to its desired voltage level very rapidly.

One of the drawbacks of some prior "bootstrap" drivers is that their capacitors require a set-up time during which they are pre-charged after an input transition. Without such pre-charging, the bootstrapping effect will not occur. This effect is particularly evident when conventional bootstrap drivers are used in a fully asynchronous environment. In addition, the need for a set-up time has an adverse effect on the operating speed of the memory.

Further, conventional bootstrap drivers tend to be adversely affected by "glitches" (undesired voltage transients) received at their inputs. In some cases, a glitch may cause the pre-charge on the bootstrapping capacitor to be dissipated, thereby rendering the bootstrapping effect inoperative until the next cycle of pre-charge occurs.

Another drawback of prior bootstrap drivers is their tendency to consume an undesirably large amount of power. This effect is particularly disadvantageous where many of the memory's circuits are intended to be built using the same basic bootstrap driver configuration.

The problems mentioned above and other drawbacks associated with conventional bootstrap drivers have rendered them less than perfectly satisfactory, particularly for use in high speed, low power memories.

OBJECTS OF THE INVENTION

It is a general object of the invention to provide an improved bootstrap driver for use in an MOS memory.

It is a more specific object of the invention to provide a fail-safe bootstrap driver capable of use in a fully asynchronous environment.

It is another object of the invention to provide a bootstrap driver which needs no pre-charging interval after an input transition, which is fast, and which consumes a relatively small amount of power.

It is a further object of the invention to provide a bootstrap circuit which is glitch-proof and which is readily modifiable for use in the construction of decoders, buffers, clock generators and the like.

BRIEF DESCRIPTION OF THE FIGURES

The objects stated above and other objects of the invention are set forth with more particularity in the following detailed description and in the accompanying drawings, of which.

DESCRIPTION OF THE PREFERRED EMBODIMENT

Figure 1:
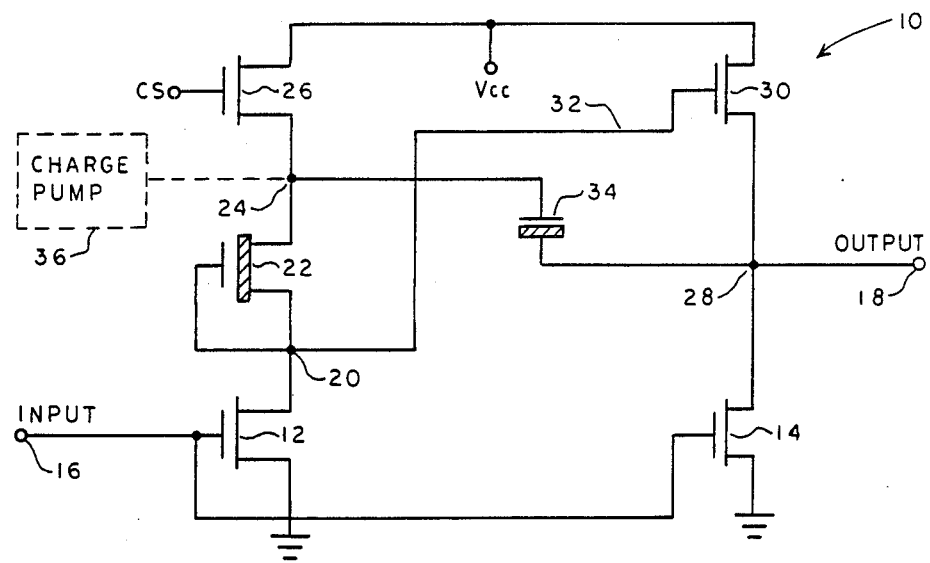
FIG. 1 is a schematic diagram of a bootstrap driver according to the invention.

Referring now to FIG. 1, a bootstrap driver 10 is depicted which may be used as a high speed, low power inverting driver. With modifications which are described below, the driver 10 may be modified for use as a row or column decoder, a chip select buffer, a clock generator, or any other type circuit for use in an MOS memory where high speed and low power operation is desirable.

As shown, the driver 10 includes first and second low impedance enhancement mode transistors 12 and 14 each having a gate at which a digital input signal is received from an input terminal 16. Typically, the signal at terminal 16 varies between zero volts and five volts, and the driver 10 develops an inverted output signal which varies between $V_{cc}$ (the operating voltage) and ground at an output terminal 18.

Coupled to the drain of the transistor 12 at a first node 20 is a high impedance depletion mode transistor 22. The gate of the transistor 22 is also coupled to the node 20 so that the transistor 22 functions as a normally on high impedance.

The drain of the transistor 22 is coupled to a second node 24 to which the source of a third low impedance transistor 26 is also coupled. In this embodiment, the transistor 26 is shown as an enhancement mode transistor. However, this transistor may be a zero threshold, enhancement or depletion mode device. The drain of the transistor 26 is coupled to the operating voltage $V_{cc}$ and its gate receives a voltage rendering the tranistor normally conductive. In the illustrated embodiment, the gate of the latter transistor receives a chip select (CS) signal for turning the driver 10 on during its active mode and for powering down the driver during a standby mode. If such "power-down" capability is not needed for a particular application, the gate of transistor 26 may be coupled to $V_{cc}$ rather than to the chip select signal.

Referring now to the transistor 14, its drain is coupled to a third node 28, the latter node also being coupled to the source of a fourth enhancement mode transistor 30. The drain of the transistor 30 is coupled to $V_{cc}$ and its gate is coupled via a lead 32 to the node 20. In addition, a capacitor 34 is connected between the nodes 24 and 28. The latter capacitor may be formed from an enhancement or depletion mode transistor whose source is tied to its drain.

Best performance of the driver 10 is effected by selecting the depletion mode transistor 22 to be a high impedance or small area device and by selecting the other four transistors to be large area or low impedance devices. For example, the gate width to length ratio (W:L) of the depletion mode transistor may be 8:8, the W:L ratio of the transistor 12 may be 30:3, the W:L ratio of the transistor 14 may be 100:3, the W:L ratio of the transistor 26 may be 39:3, and the W:L ratio of the transistor 30 may be 100:3. Clearly, other ratios may be used as long as the W:L ratio of the depletion mode transistor 22 is much less than the W:L ratios of the enhancement mode transistors. With this provision, the transistor 22 operates as a voltage divider in conjunction with the transistor 26, as will be evident from the description of operation which follows.

Assuming that the signal CS is high and that a high level signal is received at the input terminal 16, the transistors 12, 14, 22 and 26 are on. The transistor 22, of course, is always in a conductive mode because its gate is tied to its source. Consequently, the voltages at nodes 20 and 28 are low, the voltage at node 24 is high, (because of the low "on" impedance of the transistor 26 and the high "on" impedance of the transistor 22). Because the voltage at node 20 is low, the transistor 30 is off. The signal at the output terminal is, of course, low because it is directly connected to the node 28 which is grounded through the transistor 14.

In this condition, no current flow exists through the transistors 30 and 14 because the transistor 30 is off. In addition, because transistor 22 is a high impedance device, a relatively small amount of power is being dissipated.

When the signal at the input terminal 16 goes low, transistors 12 and 14 start turning off and the potential at node 20 rises to turn on the transistor 30, thus causing the potential at node 28 to rise toward $V_{cc}$. The positive-going voltage transition at node 28 is coupled by the capacitor 34 to the node 24 so that the potential at node 24 is driven higher. The latter increase in potential is coupled by the transistor 22 to the node 20 so that the transistor 30 is turned on harder. Thus, the potential at node 28 rises further. This regenerative cycle continues until the potential at node 28 and at the output terminal 18 reaches $V_{cc}$. In the case in which $V_{cc}$ is 5 volts, the potential at node 24 is bootstraped to about 7 volts.

When the signal at the input terminal 16 again assumes a high level, the driver 10 resets to its initial condition described earlier which causes the potential at the output terminal 18 to be driven to ground. Thus, the signal at terminal 18 varies between ground and $V_{cc}$ in response to high and low logic levels at the input terminal 16.

As thus described, the driver 10 may be used in a synchronous environment such as in a dynamic RAM (random access memory). As described below, a significant modification to the driver 10 adapts it for fail-safe use in a fully asynchronous environment. In addition, further modifications enable the basic driver to be used as a row or column decoder, various types of buffers, clock generators, and the like. In the case where the driver 10 is to be used in an asynchronous environment such as in a static RAM, some provision is usually necessary to maintain a voltage differential across the capacitor 34 to ensure that bootstrapping takes place. For this purpose, a charge pump 36 may be coupled to the node 24 in order to maintain or refresh the high potential thereat to compensate for charge leakage from the node 24. A preferred charge pump suitable for this purpose is described hereinafter.

The bootstrap driver 10 operates in synchronous as well as asynchronous environments. It may be thought of as a pseudo-dynamic driver whose low power and high operating speed make it particularly attractive for use in a variety of applications, examples of which are described below.

A further significant advantage of the driver 10 is that it employs no zero-threhold or so-called "natural" devices which require tight control of processing parameters. Such zero-threshold devices normally include a threshold voltage which is temperature sensitive and which makes it difficult to completely turn this type of transistor off during power-down. Consequently, bootstrap drivers employing such transistors tend to consume more power than is desirable. In addition, such transistors tend to require a rather large area for their fabrication. Because the driver 10 employs no zero-threshold devices, it does not suffer from those disadvantages.

Figure 2:
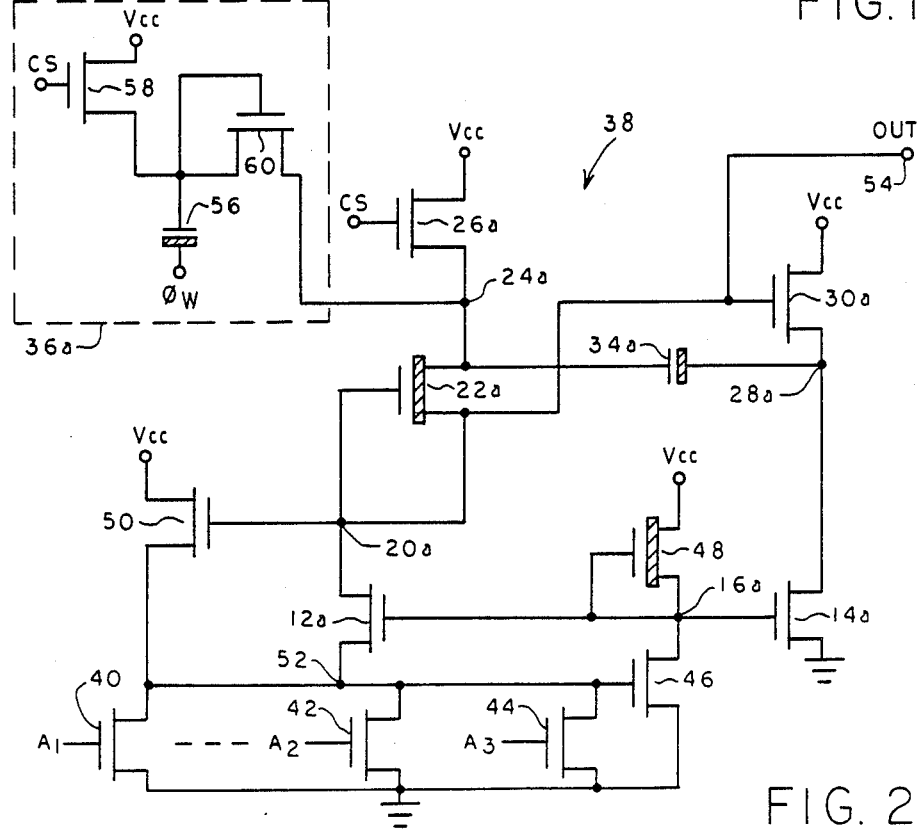
FIG. 2 depicts the bootstrap driver of FIG. 1 as modified to function as a column or row decoder.

Referring now to FIG. 2, a fail-safe bootstrap driver circuit is shown which is adapted for use in a fully asynchronous environment. In the illustrated embodiment, this driver is shown in the form of a decoder 38, although the basic structure may be used in a variety of other applications. Transistors and other components of the decoder 38 that correspond to components of FIG. 1 are given corresponding reference numerals followed by an alphabetical designation. For example, transistor 12a of FIG. 2 provides a function which is similar to the function provided by transistor 12 of FIG. 1. Thus, the basic bootstrap driver circuit in the decoder 38 includes transistors 12a, 14a, 22a, 26a, 30a and a capacitor 34a.

The illustrated decoder 38 also includes transistors 40, 42 and 44 for receiving bits A1, A2 and A3 of a memory address input (additional transistors may be included to receive additional bits of a memory address), an inverter comprising an enhancement mode transistor 46 and a depletion mode transistor 48, and another enhancement mode transistor 50. As shown, the drains of the transistors 40-44 are coupled to a common node 52 such that the latter node is pulled low whenever one of the inputs A1, A2 or A3 is high.

In a condition in which the chip select (CS) is high and the memory address line A1 goes high, the transistor 40 conducts to pull down the voltage at node 52 to near ground. Because the gate of the transistor 46 is coupled to the node 52, the transistor 46 turns off, raising the potential at the node 16a to $V_{cc}$, the latter node essentially constituting the input to the basic driver circuit. With the gates of transistors 12a and 14a coupled to the node 16a, both transistors begin to conduct. A current path is thus established from $V_{cc}$ to ground through transistors 26a, 22a, 12a and 40.

As a consequence of the on condition of transistors 12a and 40, the potential at node 20a is lowered nearly to ground and the transistor 30a is held off. As shown, the output terminal 54 is, in this embodiment, also coupled to the node 20a, whereby a potential near ground is established at that output terminal.

Should the bit A1 now go low (bits A2 and A3 are also assumed to be low), the transistor 40 begins turning off and the potential at node 52 begins to rise. Hence, the transistor 46 begins conducting and thereby lowers the potential of node 16a nearly to ground potential. As a result, the transistor 14a begins turning off. In addition, the combined effect of the potential at node 52 going high and the potential at node 16a going low causes the transistor 12a to turn off rapidly. Consequently, the potential at node 20a rises rapidly, the transistor 30a turns on, and the potential at node 28a rises. The latter increase in potential is coupled to the node 24a by the capacitor 34a, and is coupled to the node 20a by the high impedance transistor 22a. Hence, the transistor 30a conducts harder, and the regenerative cycle continues until the potential at node 20a and at the output terminal 54 is bootstrapped to about 7 volts. Hence, when all of the bits A1–A3 go from a high level to a low level, the output terminal 54 is bootstrapped from ground to about 7 volts. Also, node 28a is driven to $V_{cc}$. Transistor 50 pulls node 52 to $V_{cc}$ when transistor 12a turns off and node 20a goes to 7 volts. Otherwise, the voltage on node 52 would fall to a low value again.

As stated above with reference to FIG. 1, it is desirable to maintain a differential voltage across the capacitor 34 (and 34a) to ensure proper bootstrapping operation. In the FIG. 2 embodiment, such a differential voltage is maintained in two ways. Specifically, if node A1 goes low turning the transistor 40 off (assuming, of course, that transistors 42 and 43 are already off), the path to ground from node 20a will quickly be severed. The resulting increase in potential at node 52 begins turning the transistor 46 on so that the potential at node 16a begins dropping. When the potential at node 16a drops sufficiently, the transistor 14a turns off to sever the path to ground from node 28a. Thus, the delay associated with the inverter comprising transistors 46 and 48 holds the node 28a to ground for a longer interval than the node 20a is held to ground. Consequently, a differential voltage is maintained across the capacitor 34a for a low going transition at A1.

When input A1 goes high, transistor 40 turns on pulling node 52 low. As mentioned previously, node 16a goes high. Since node 16a is coupled to the gates of transistors 12a and 14a, both of those transistors turn on at the same time. Therefore, nodes 20a, 24a and 28a begin discharging at the same time. This action insures that the voltage across capacitor 34a is not reduced when input A1 goes high. Since the voltage across the capacitor 34a is never degraded for any transition on input A1, the bootstrapping action will work properly for any input transition.

The other way in which a differential voltage of the desired magnitude is maintained across the capacitor 34a is by use of a charge pump 36a. The pump 36a includes a capacitor 56 and a pair of enhancement mode transistors 58 and 60. The gate of the transistor 58 receives the chip select signal so that, during normal operation, the transistor 58 is on. The capacitor 56 receives a gating signal, identified as $\phi W$, which may be a 5 megahertz square wave whose amplitude varies between zero and five volts. The gate and source of the transistor 60 are coupled to the source of the transistor 58 and to the capacitor 56. The drain of the transistor 60 is connected to the node 24a. With this arrangement, the transistor 60 is periodically turned on by the signal $\phi W$ to supply periodic packets of charge to the node 24a whenever the potential of that node decays. Hence, node 24a is maintained at a potential of about 7 volts and, because the node 28a reaches no more than about 5 volts, a voltage differential is maintained across the capacitor 34a.

In order to properly effect a rapid bootstrap operation, it is required that the potential at node 20a be permitted to rise rapidly in response to a low level input received by one or more of the transistors 40–44. Any capacitance coupled to the node 20a will, of course, slow the rise time of a voltage increase at that point. Hence, to isolate the node 20a from capacitance associated with the node 52, the transistor 12a is rapidly turned off whenever one of the inputs A1–A3 goes low. Such rapid turn off occurs because, as input A1, for example, goes low, the potential as node 52 rises and the potential at the node 16a falls. Thus, the transistor 12a is quickly turned off to permit the potential at node 20a to rise rapidly.

To ensure that the transistor 12a remains off, the transistor 50 has its gate connected to the node 20a and its source coupled to the source of the transistor 12a at node 52. Hence, when the transistor 12a turns off and the potential at node 20a rises, the latter potential causes the transistor 50 to turn on. Consequently, the transistor 50 supplies a flow of charge to the node 52 to maintain its high potential so as to hold the transistor 12a in an off condition.

Absent the transistor 50, the potential at node 52 could decay to the point where the transistor 12a becomes somewhat conductive, the transistor 46 turns off, and the potential at node 16a rises to turn on the transistor 14a. The inclusion of the transistor 50 avoids this problem. In fact, the combination of the transistors 50 and 12a operate as a Schmitt trigger which rapidly initiates a regenerative turn off and hold off of the transistor 12a when the latter starts to lessen its level of conduction.

Another advantage provided by the transistor 50 is that it back biases the transistor 12a to the point where substantially no sub-threshold leakage current flows in the transistor 12a and, therefore, charge leakage from the node 20a is eliminated. Such back biasing of the transistor 12a occurs because, when the inputs A1–A3 are low, the transistor 46 conducts to hold node 16a and the gate of transistor 12a near ground potential. In this condition, the transistor 50 is on to hold the node 52 and the source of transistor 12a near $V_{cc}$. Hence, the gate-to-source voltage of the transistor 12a is approximately minus $V_{cc}$. Hence, the transistor 12a is reverse biased to the point where essentially no subthreshold leakage current flows.

When the decoder 38 is powered down by the signal CS going low, the transistors 26a and 58 are turned off. Hence, the pump 36a is turned off and the current path from $V_{cc}$ to ground through transistors 26a, 22a and 12a is cut off. If any one of the inputs A1–A3 are high, the node 52 goes low and pulls the node 20a low because the node 24a is no longer clamped to a high level. Hence, the low level at node 20a causes the transistor 30a to turn off and thus cut off the only other current path between $V_{cc}$ and ground. Thus, the decoder 38 dissipates substantially no power when it is in its standby or powered down mode.

The decoder 38 also includes a self-timed power-up feature to establish a differential voltage across the capacitor 34a when the chip select signal goes high. When the latter event occurs, the transistor 26a conducts immediately to raise the voltage at node 24a. The voltage at node 20a also rises, whereupon the transistor 50 conducts to raise the voltage at node 52. The transistor 46 then conducts to lower the voltage at node 16a and turn the transistor 14a off. Prior to the transistor 14a being turned off, the node 28a had been clamped to ground while the voltage at node 24a was rising. This delay in turning the transistor 14a off causes a differential voltage to be quickly established across the capacitor 34a so that proper bootstrapping operation can begin.

It will be appreciated that the decoder 38 may be used in synchronous as well as asynchronous environments without the need for a pre-charge cycle, thereby increasing the operating speed of the memory. Of course, the charge pump 36a may be eliminated in the case wherein the decoder is used in a synchronous environment.

Figure 3:
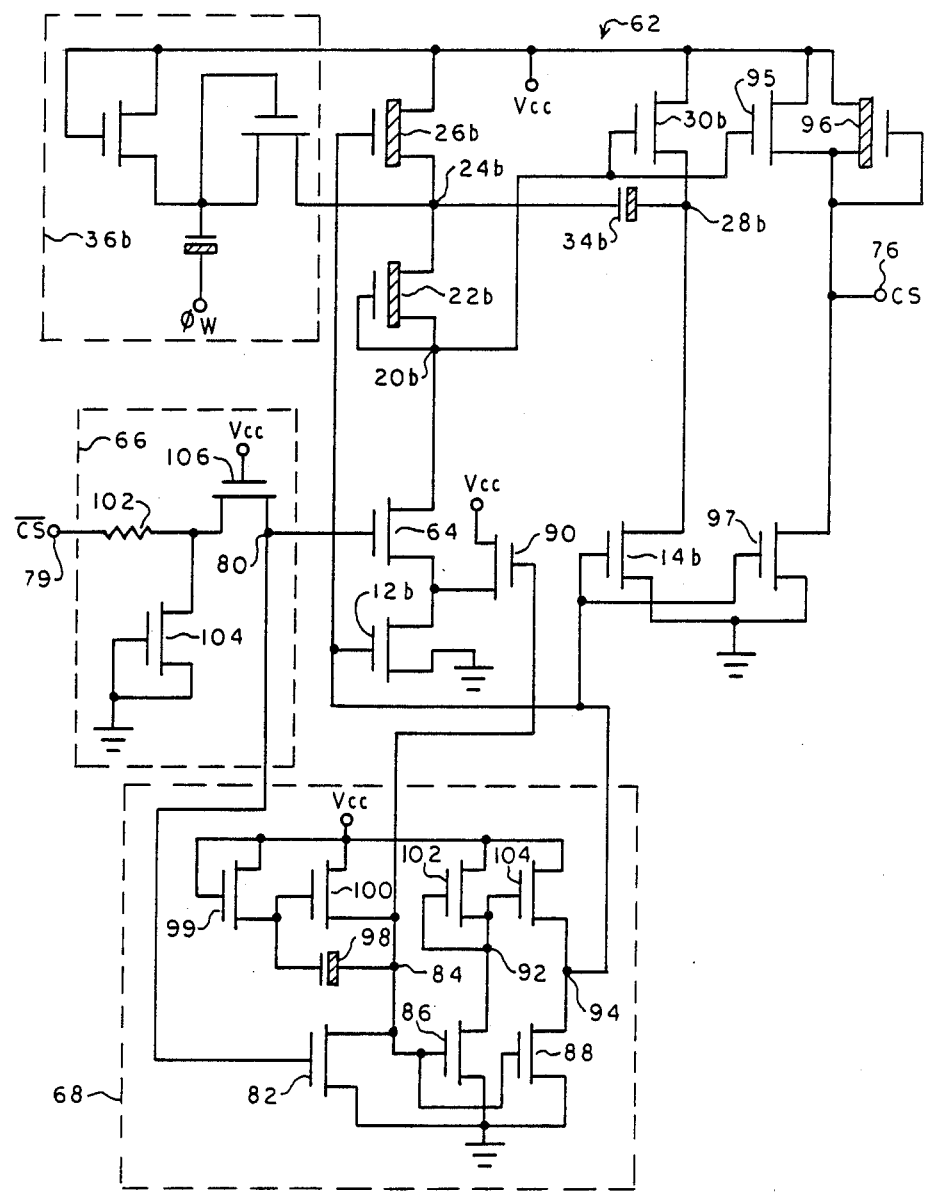
FIG. 3 depicts a modified bootstrap driver in association with additional circuitry to provide a chip select buffer.

Referring now to FIG. 3, a chip select buffer 62 is shown which employs a modified version of the driver shown in FIG. 1. The basic function of the buffer 62 is to generate a chip select (CS) signal at the terminal 76 in response to a $\overline{CS}$ signal received at an input 79, and to develop the CS signal at high speed and with low power consumption.

In the illustrated embodiment, the bootstrap driver circuit includes transistors 12b, 14b, 22b, 26b, 30b, a capacitor 34b coupled between nodes 24b and 28b, and an additional transistor 64 which is coupled in series with the transistor 12b. For reasons set forth below, the transistor 26b is selected to be low impedance depletion mode transistor rather than a low impedance enhancement mode transistor as used in FIGS. 1 and 2.

Coupled with the bootstrap circuit is a charge pump 36b of the type described above, an input protection circuit 66, and a timing circuit 68.

When $\overline{CS}$ is high, a high level signal is applied to a node 80 which is coupled to the gate of transistor 64 and to the gate of another transistor 82 in the timing circuit 68. Both these transistors are thus turned on. With the transistor 82 on, its drain (node 84) is pulled low, and that low voltage is coupled to the gates of transistors 86, 88 and 90. Consequently, all the latter transistors are turned off, and the potentials at the drains of transistors 86 and 88 (nodes 92 and 94, respectively) rise to a high level.

The gates of transistors 12b and 14b are both coupled to the node 94; hence, the high level signal thereat turns both transistors on. It will be recalled that transistor 64 has been previously turned on by the high level TTL signal at node 80. Hence, transistors 12b and 64 constitute a low impedance path between ground and the node 20b.

Referring now to the transistor 26b, it is selected to be a low impedance depletion mode transistor in order to bring the node 24b to a higher voltage level than is possible with an enhancement mode transistor receiving the same gate voltage. Because there is no significant gate-to-source voltage drop across the transistor 26b, the node 24b is clamped close to $V_{cc}$ when the transistor 26b is turned on by the voltage at node 94. Because the transistor 22b is a high impedance device and the conducting transistors 64 and 12b constitute a low impedance to ground, the potential at node 20b is approximately ground potential.

As shown, the gate of transistor 30b and the gate of an output transistor 95 are coupled to the node 20b. Hence, both these transistors are driven off by the low potential at node 20b.

The output terminal 76 is coupled to the source of the enhancement mode transistor 95, to the source of a depletion mode "keeper" transistor 96, and to the drain of another enhancement mode transistor 97. The latter transistor's gate is coupled to the node 94 so that the transistor 97 is on in response to the high level potential now present at the node 94. Hence, the output signal CS at terminal 76 is at approximately ground potential in this quiescent state.

Assuming now that the input signal $\overline{CS}$ goes low, the node 80 is driven low to reduce the conductivity of the transistor 82 and to reduce conduction in the transistor 64. The latter transistor is completely turned off when node 84 goes high to turn transistor 90 on. This biases the source of transistor 64 to ensure its turn off.

In response to the low potential at node 80, the timing circuitry 68 operates to completely turn off the transistors 12b and 64, and to turn off the transistor 26b at the correct time. If the transistor 26b is turned off too late, the node 24b will remain clamped close to $V_{cc}$ and be unable to bootstrap. Likewise, if the transistor 26b is turned off too soon (before bootstrapping begins), the potential at node 24b tends to fall. The timing circuit 68, therefore, regulates the turn off time of the transistor 26b so that proper bootstrapping occurs. The way in which such timing is effected is described immediately below.

As stated above, the transistor 82 was turned off by the low potential at node 80. Consequently, the potential at node 84 is driven high. The positive-going transition is coupled via a capacitor 98 to the source of a transistor 99 and to the gate of another transistor 100 which are connected in circuit so as to hold the node 84 at its high level.

The high level voltage on node 84 is coupled to the gates of transistors 86 and 88 which have load transistors 102 and 104. Hence, the potentials at the drains of transistors 86 and 88 (nodes 92 and 94) are pulled low. The low potential at node 94 serves to turn off the transistor 26b. Transistors 14b and 97 are turned off by the same low level voltage.

Referring again to the node 84, the high level potential it carries is coupled to the gate of the transistor 90 for turning it on so as to raise the potential at the source of the transistor 64. The increased voltage at the source of transistor 64, along with the low voltage at its gate, serves to completely cut off this transistor.

With transistors 64 and 12b now turned off, the potential at node 20b rises, thereby turning on the transistors 30b and 95 and raising the potentials at node 28b and at the output terminal 76. The positive-going voltage transition at node 28b is coupled by the capacitor 34b back to node 24b, and the transistor 22b transfers this rise in voltage to the node 20b. Hence, transistors 30b and 95 conduct harder, and this regenerative cycle continues until node 28b is pulled to $V_{cc}$ and node 24b is bootstrapped to about 7 volts (in the case where $V_{cc}$ is 5 volts). Consequently, the source of transistor 26b is biased by about 7 volts and is rendered completely non-conductive. At this point in time, the output signal CS is, of course, pulled to a high level voltage near $V_{cc}$. When the input signal $\overline{CS}$ again rises to a high level, the output signal CS is rapidly driven low.

It can be seen, therefore, that the transistor 26b is a dynamically cut off clamp which allows the potential at node 24b to start near $V_{cc}$ and to be bootstrapped to a higher voltage when the input signal $\overline{CS}$ goes low. Starting the potential at node 24b at that high level causes very rapid bootstrapping so that the output signal CS is driven high rapidly.

As mentioned previously, the circuit 66 provides input protection for the chip select buffer. Toward this end, the input lead 79 is coupled via a polysilicon resistor 102 to the drain of a transistor 104 and to a series pass transistor 106. With this arrangement, the resistor 102 limits the current flowing to the node 80 and the transistor 104 punches through at high static levels on the input lead 79 to keep the voltage at node 80 from rising high enough to break down the gate oxide of the transistor 64. It is believed that the transistor 106 enhances the extent of input protection when $V_{cc}$ is not powered up.

The charge pump 36b has been described previously. Suffice it to say that this pump causes a small amount of charge to flow to the node 24b to maintain that node at its high potential so as to compensate for charge leakage therefrom.

Figure 4:
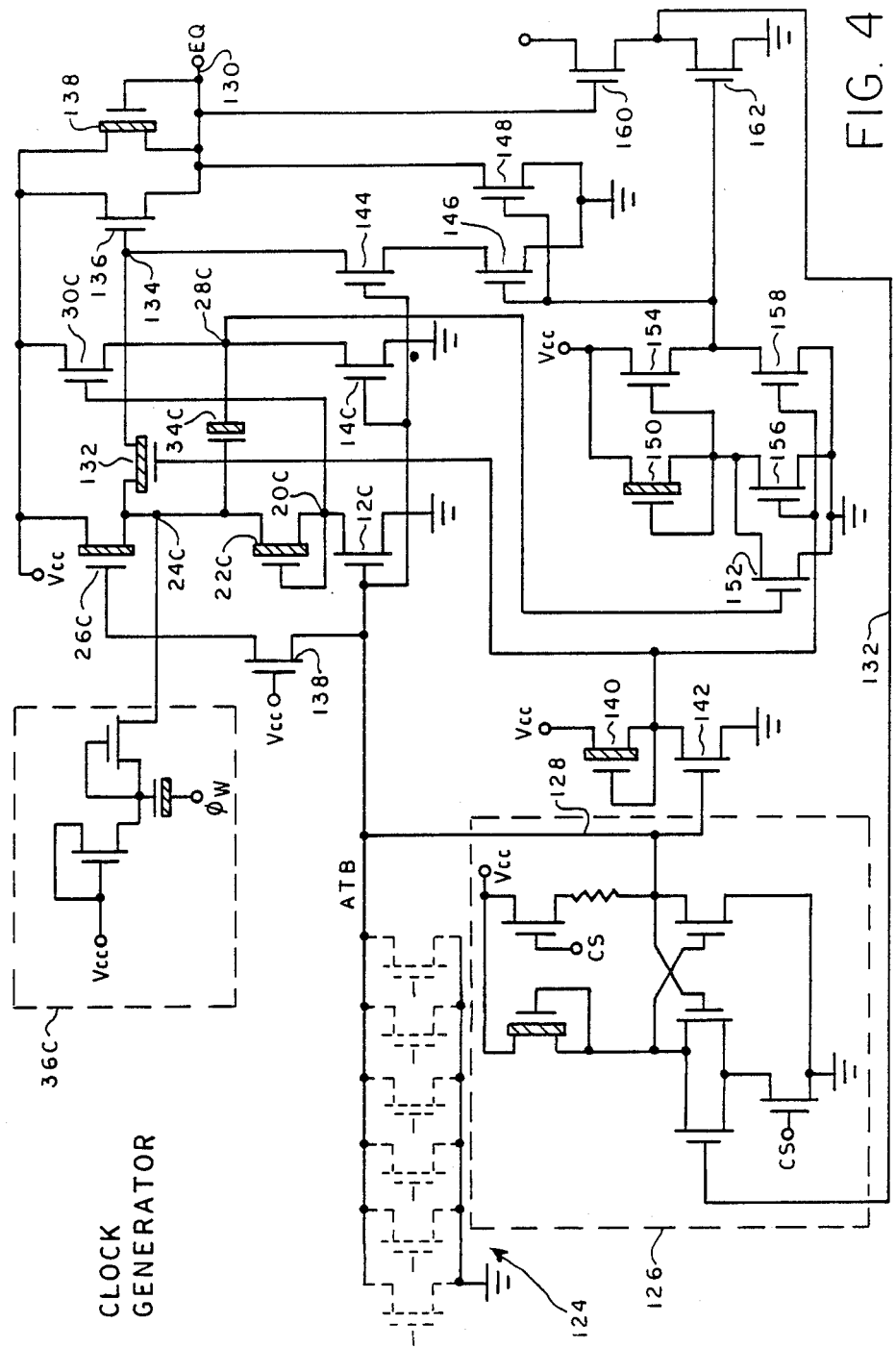
FIG. 4 depicts the modified bootstrap driver in association with other circuitry to provide a clock generator for a static RAM.

Referring now to FIG. 4, a clock generator is shown which also employs a bootstrap driver circuit of the type described above. The transistors 12c, 14c, 22c, 26c and 30c, and the capacitor 34c constitute the bootstrap driver circuit, and a charge pump 36c supplies a small amount of charge to the node 24c as previously described.

The illustrated clock generator is designed for use in a static RAM of the type described in U.S. application Ser. No. 64,283, filed June 30, 1980, now U.S. Pat. No. 4,355,377 owned by Inmos Corporation, the Assignee of the present application. The RAM in the latter application effects bit line equilibration and pre-charging in response to a change in row address data received by the RAM. When a change is sensed in the status of one or more row address bits, address transition detectors (not shown herein) turn on one or more of the transistors 124 shown in phantom in FIG. 4 for pulling an address transition buss (ATB) low.

A latch and release network 126 holds the ATB buss low via a lead 128 while the remainder of the clock generator develops a positive going EQ pulse on an output lead 130. When the EQ pulse goes high, a signal is fed back to the network 126 via lead 132 to release the ATB buss and permit it to charge to its normally high level at a controlled rate. As the potential of the ATB buss rises, the clock generator pulls the output lead 130 low to terminate the EQ pulse. Hence, the ATB buss is held low for a self-timed interval and the output signal EQ is held high for a related interval. As described in the above-mentioned application, the EQ pulse at lead 130 may be used to activate transistors which equilibrate and pre-charge the RAM's bit lines.

Referring more specifically to the bootstrap driver, its input is the ATB buss which is coupled to the gates of transistors 12c and 14c. When the ATB buss goes low, transistors 12c and 14c are turned off; consequently, the voltage at the drain of transistor 12c (node 20c) rises to turn on the transistor 30c and raise the voltage at node 28c. That voltage rise is coupled back to node 20c via the capacitor 34c and the depletion mode transistor 22c. The increase in voltage at node 20c turns transistor 30c on harder, and the regenerative cycle continues, rapidly raising the node 28c to the supply voltage $V_{cc}$ and raising the drain of transistor 22c (node 24c) to approximately seven volts in the case where $V_{cc}$ is equal to five volts. The voltage on the node 24c will be coupled via a transistor 132 to another node 134 for application to the output terminal 130 via a transistor 136. A "keeper" transistor 138 is coupled between $V_{cc}$ and the output terminal 130 to maintain the potential there at a high level.

Associated with the bootstrap driver is another transistor 138 which is coupled to the ATB buss via its source and to the gate of the transistor 26c via its drain. With this arrangement, a low level transition on the ATB buss is delayed by the transistor 138 so that the gate of the transistor 26c does not go low until the transistor 12c is completely off. This prevents the voltage at node 24c from dropping below its high level potential to which it is clamped by the transistor 26c.

As described briefly above, the transistor 132 couples the high voltage at node 24c to the transistor 136 and the latter transistor drives the output 130 high. The transistor 132 also serves to prevent an unwanted positive excursion or glitch on the ATB buss from pulling the output lead 130 low. This effect is achieved by coupling the gate of the transistor 132 to an inverter comprising transistors 140 and 142. The gate of the transistor 142 is coupled to the ATB buss so that, when a glitch drives the ATB buss high, the transistor 142 turns on and lowers the voltage on the gate of the transistor 132. Hence, the transistor 132 is turned off and thereby isolates node 24c from the node 134. Any drop in the potential at node 24c due to a glitch is thus isolated from the output lead 130.

The remainder of the circuitry shown in FIG. 4, comprising transistors 144-162, serves primarily to ensure that the signal EQ goes high quickly and stays high for a self-timed interval. Driving the EQ signal high rapidly is necessary to ensure that equilibrating the pre-charging of the bit lines begins prior to selection of a word line. The interval over which the EQ signal is held high is selected to be long enough to cause the bit lines to become fully equilibrated and precharged, but not so long as to reduce the operating speed of the RAM.

A detailed description of the operation of the transistors 144-162, as well as the operation of the latch and release network 126, is not necessary for an understanding of the present invention. Such a description is included in the above-mentioned patent application, the pertinent teachings of which are incorporated herein by reference. Suffice it to say that when the ATB buss is driven low, the clock generator develops high level output signal EQ which remains high for a self-timed interval. When the EQ signal starts its rise, the latch and release network 126 releases the ATB buss so that it may revert to its normally high level.

Figure 5:
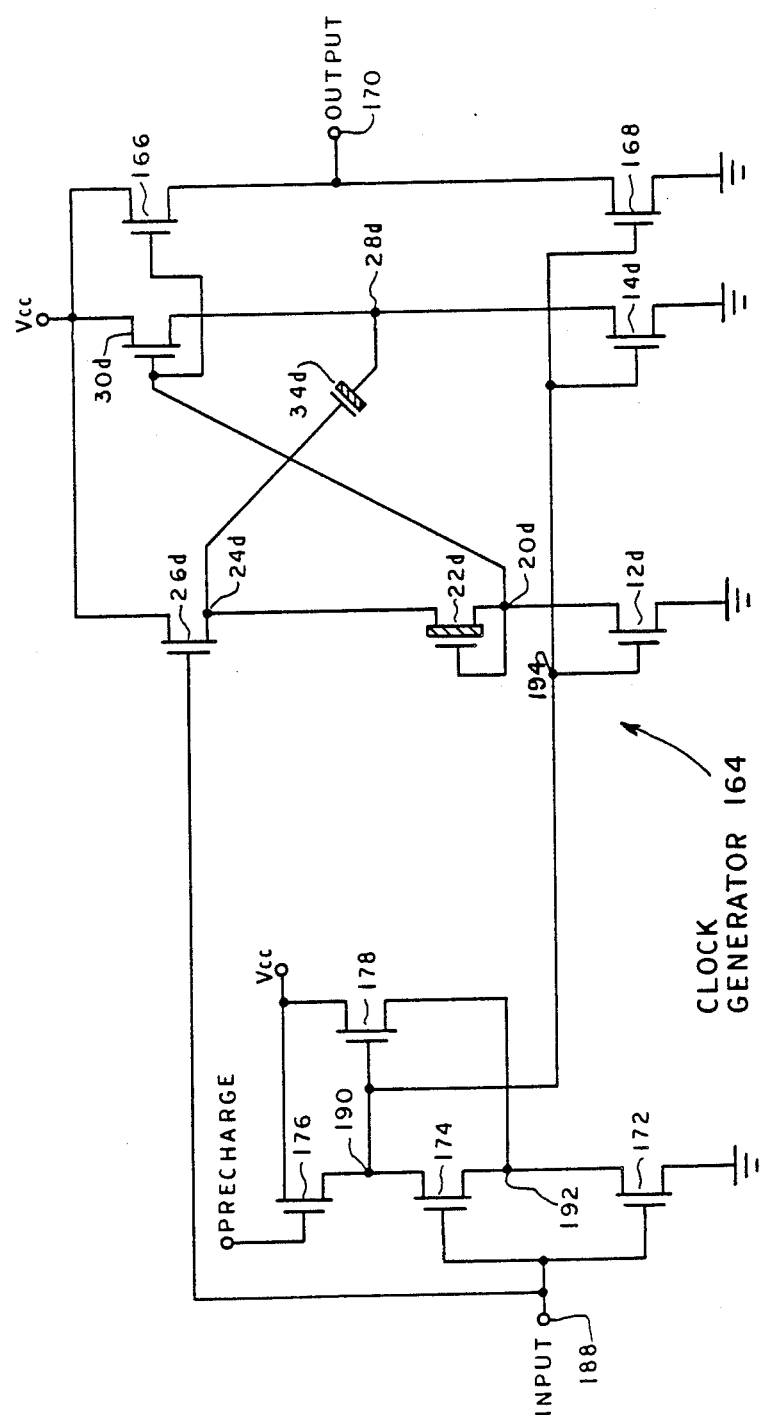
FIG. 5 shows the bootstrap driver of FIG. 1 in association with additional circuitry to provide a clock generator for a dynamic RAM.

Referring now to FIG. 5, a clock generator 164 is shown for use in a dynamic RAM. Conventionally, dynamic RAMS include a pre-charge interval for setting up their bootstrap circuits, and a subsequent interval during which the bootstrap circuit responds to an input signal. The bootstrap driver employed by the clock generator of FIG. 5 is very similar to those described above in that it includes a low impedance transistor 26d (an enhancement mode transistor in this case), a high impedance depletion mode transistor 22d, low impedance transistors 12d, 14d and 30d, and a capacitor 34d. A pair of output transistors 166 and 168 are coupled via their gates to the gates of transistors 30d and 14d, respectively, and their drains are coupled to an output terminal 170.

As stated above, the present driver is adapted to be pre-charged and then bootstrapped. For that purpose, the clock generator includes an input stage comprising transistors 172-178.

As shown, the gate of transistor 176 is adapted to receive a high level pre-charge signal in order to hold node 190 high. This high voltage is coupled to the gates of transistors 12d, 14d and 168 to hold the output of the clock at ground potential. When the pre-charge signal goes low, an input signal received by lead 188 goes high to pre-charge the capacitor 34d and, after a short delay, activate the bootstrap driver to develop its output signal at terminal 170.

Assuming now that the input signal is low and that the pre-charge signal is high, the transistor 176 is driven on. The source of the transistor 176 (node 190) therefore goes high to turn on the transistor 178 whose source (node 192) is also driven high, thereby source-biasing the transistor 174. The transistors 172 and 174 are, of course, off.

During pre-charge, a high level voltage is developed at the source of transistor 176 (node 194). Consequently, transistors 12d, 14d and 168 are on and their drains (nodes 20d, 28d and terminal 170) are pulled low. The low level voltage at node 20d turns the transistors 30d and 166 off.

At this time, the transistor 26d is off because its gate (node 196) is low during pre-charge. Thus, because the nodes 20d and 28d are grounded through the conducting transistors 14d and 12d, and because the transistor 26d is off, there is substantially no voltage across the capacitor 34d.

Assuming now that the pre-charge signal goes low and the input signal at lead 188 goes high, that high level is coupled to the gate of transistor 26d, whereupon the transistor 26d turns on to raise the voltage at node 24d. Initially, the high level voltage previously developed at node 194 is not dissipated because the source bias on the transistor 174 holds that transistor off momentarily. Hence, the voltage at node 194 remains high temporarily, and transistors 12d, 14d and 168 remain on. Node 28d is, therefore, still grounded. Consequently, a voltage somewhat less than $V_{cc}$ is established across the capacitor 34d.

After a short delay, the transistor 172 conducts hard enough so that the voltage at node 192 is lowered while the voltage at the gate of transistor 174 rises. Thus, the transistor 174 turns on and pulls the voltage at nodes 190 and 194 to near ground potential. Consequently, transistors 12d, 14d and 168 are now turned off.

The voltage at node 20d now rises to turn on the transistors 30d and 166, wherefore the voltages at node 28d and at the output terminal 170 rise. The increase in potential at node 28d is coupled via the capacitor 34d to the node 24d and, via the transistor 22d, to node 20d. Consequently, the transistors 30d and 166 conduct harder, and the regenerative bootstrap cycle continues until the voltage at output terminal 170 is bootstrapped to $V_{cc}$.

In addition to the advantages gained by virtue of the bootstrap driver, the clock generator at FIG. 5 exhibits further advantages which are attributable to the input stage comprising transistors 172, 174, 176 and 168. These latter transistors collectively function as a dynamic Schmitt trigger for coupling the pre-charge signal from the gate of transistor 176 to the gates of the transistors 12d, 14d and 168 (node 194), and for coupling an inverted and delayed input signal to the same node. For optimum operation, the signal received at the node 194 should have a substantially invariant waveshape which is insensitive to power supply variations, temperature variations and process parameters. The illustrated arrangement of the transistors 172–176 provides such an invariant waveshape.

Although the bootstrap driver has been shown and described as part of but several circuits which find use in MOS memories, it will be appreciated that many other circuits may advantageously use this boot strap driver. Its high speed and low power characteristics provide superior performance for a variety of buffers, decoders, inverters and the like.

Further, it will be obvious to those skilled in the art that, without departing from the invention, a variety of modifications and alterations may be made to the bootstrap driver and to the circuits described herein which employ the bootstrap driver. Accordingly, it is intended that all such alterations and modifications be considered within the spirit and scope of the invention as defined by the appended claims.

What is claimed is:

1. In combination:
  a static RAM;
  a bootstrap driver circuit in said RAM for receiving a digital input signal and providing a digital output signal; and
  a charge pump coupled to said bootstrap driver circuit for compensating for voltage decay therein;
  said bootstrap driver circuit comprising:
  first and second field effect transistors each having a gate connected for receiving a signal which varies between high and low levels;
  a high impedance field effect transistor having its gate coupled to its source and its source coupled to the drain of said first transistor to define a first node thereat;
  a low impedance field effect transistor having its drain coupled to a source of operating voltage and its source coupled to the drain of said high impedance transistor to define a second node thereat, said low impedance transistor being gated for coupling a high level voltage to said second node;
  a third field effect transistor having its drain coupled to a source of operating voltage, its source coupled to the drain of said second field effect transistor to define a third note thereat, and having its gate coupled to said first node;
  a capacitor coupled between said second and third nodes;
  a grounded source field effect transistor having a gate coupled to receive said input signal and having a drain coupled to a common node, said common node being coupled to the source of said first field effect transistor; and
  transistor means coupled to said common node for inverting the signal thereat and for coupling the inverted signal as a delayed input signal to the gates of said first and second field effect transistors such that said second transistor remains momentarily conductive to provide a discharge path for said third node in response to a low level input signal applied to said grounded source field effect transistor thereby to maintain a differential voltage across said capacitor;
  said charge pump being coupled to said second node.

2. The combination according to claim 1 further including an additional field effect transistor having its gate coupled to said first node, its drain coupled to a source of operating voltage, and its source coupled to said common node such that when a low level input signal is applied to said grounded source field effect transistor, said grounded source transistor turns off for holding said common node at a high voltage level and for maintaining said first field effect transistor in an off condition to isolate said common node from said first node.

3. In a static RAM having means responsive to an enable signal for controlling the RAM to be either in an active mode or a standby mode, the combination comprising:
  a driver circuit for receiving a digital input signal and providing a digital output signal and having a capacitor in a regenerative feedback loop for bootstrapping the output signal to a desired level; and a charge pump coupled to said capacitor for maintaining a voltage differential across said capacitor and having means responsive to said enable signal for turning on said charge pump during the RAM's active mode and for turning off the charge pump during the RAM's standby mode.

4. The combination of claim 3 wherein said driver circuit includes:

first and second field effect transistors each having a gate connected for receiving a digital input signal which varies between high and low levels, said transistors being connected to turn on and off in response to high and low levels, respectively, of the input signal;

a high impedance field effect transistor having both its source and its gate coupled to the drain of said first transistor so as to define a first node thereat;

a low impedance field effect transistor having its drain coupled to a source of operating voltage and its source coupled to the drain of said high impedance transistor to define a second node between said high impedance transistor and said low impedance transistor, the latter transistor receiving a voltage at its gate for coupling a high level voltage to said second node;

a third field effect transistor having its drain coupled to a source of operating voltage, having its source coupled to the drain of said second transistor to define a third node thereat, and having its gate coupled to said first node;

a capacitor connected between said second and third nodes such that, when the input signal goes low, said first and second transistors turn off, said first node is pulled high, said third transistor is turned on, said third node is pulled high, the voltage transition at said third node is capacitively coupled to said second node and via said high impedance transistor back to the gate of said third transistor so as to increase the conduction of said third transistor and pull said first and third nodes to a high level for use as one or more inverted output signals; and wherein said charge pump is coupled to said second node for pumping current thereto to compensate for a voltage decay at said second node.

5. The combination of claim 4 wherein said high impedance transistor is a depletion mode transistor.

* * * * *